United States Patent [19]

Muka et al.

[11] Patent Number: 5,664,925
[45] Date of Patent: Sep. 9, 1997

[54] BATCHLOADER FOR LOAD LOCK

[75] Inventors: Richard S. Muka, Topsfield; Michael W. Pippins, Hamilton, both of Mass.; Mitchell A. Drew, Portsmouth, N.H.

[73] Assignee: Brooks Automation, Inc., Chelmsford, Mass.

[21] Appl. No.: 789,510

[22] Filed: Jan. 27, 1997

Related U.S. Application Data

[63] Continuation of Ser. No. 498,987, Jul. 6, 1995, abandoned.

[51] Int. Cl.$^6$ ................................................ B65G 49/07
[52] U.S. Cl. ........................... 414/217; 414/937; 414/939
[58] Field of Search ................................ 414/217, 331, 414/416, 752, 937, 939, 940, 941

[56] References Cited

U.S. PATENT DOCUMENTS

| | | | |
|---|---|---|---|
| 4,381,965 | 5/1983 | Maher, Jr. et al. | 156/345 |
| 4,550,242 | 10/1985 | Uehara et al | 414/331 X |
| 4,674,936 | 6/1987 | Bonora | 414/217 |
| 4,674,939 | 6/1987 | Maney et al. | 414/292 |
| 4,676,709 | 6/1987 | Bonora et al. | 414/217 |
| 4,715,921 | 12/1987 | Maher et al. | 156/345 |
| 4,724,874 | 2/1988 | Parikh et al. | 141/98 |
| 4,730,976 | 3/1988 | Davis et al. | 414/749 |
| 4,739,882 | 4/1988 | Parikh et al. | 206/454 |
| 4,802,809 | 2/1989 | Bonora et al. | 414/217 |
| 4,815,912 | 3/1989 | Maney et al. | 414/217 |
| 4,951,601 | 8/1990 | Maydan et al. | 118/719 |
| 4,995,430 | 2/1991 | Bonora et al. | 141/98 |
| 5,133,284 | 7/1992 | Thomas et al. | 118/719 |
| 5,166,884 | 11/1992 | Maney et al. | 364/468 |
| 5,169,272 | 12/1992 | Bonora et al. | 414/217 |
| 5,180,276 | 1/1993 | Hendrickson | 414/752 |
| 5,570,994 | 11/1996 | Thompson et al. | 414/416 |
| 5,590,996 | 1/1997 | Somekh et al. | 414/939 X |

FOREIGN PATENT DOCUMENTS

| | | | |
|---|---|---|---|
| 4-061146 | 2/1992 | Japan | 414/937 |
| 4-206547 | 7/1992 | Japan | 414/940 |
| WO87/07309 | 12/1987 | WIPO . | |

*Primary Examiner*—James W. Keenan
*Attorney, Agent, or Firm*—Perman & Green

[57] ABSTRACT

A system is provided for batch loading semiconductor wafers into a load lock from a portable carrier, for example, used for supporting and transporting a plurality of the wafers in spaced, stacked, relationship. The carrier is supported adjacent a chamber within the load lock. A multilevel end effector associated with the load lock chamber includes a plurality of spaced end effector sets, each set being adapted to support a wafer thereon and aligned with an associated wafer supported in the carrier. The plurality of wafers are engaged and simultaneously retrieved as a grouping, then held in the load lock chamber for subsequent transport, for example, one at a time, into an adjacent transport chamber for delivery to a specified one of a plurality of processing stations. A mini-environment may sealingly isolate the load lock chamber and the interior of the carrier from the surrounding atmosphere. Mechanisms are provided for moving the end effector sets, both elevationally and into and out of the load lock chamber, and for moving a load lock door between a closed, sealed, position and an open position and to a parked position remote from the region adjacent the load lock chamber.

8 Claims, 7 Drawing Sheets

BATCHLOADER FOR LOAD LOCK

This is a continuation applications Ser. No. 08/498,987 filed Jul. 6, 1995, now abandoned.

BACKGROUND OF THE INVENTION

1. Field of the Invention

The present invention relates to standardized mechanical interface systems for reducing particle contamination and more particularly to such systems enabling transfer of multiple semiconductor wafers at a time between a transportable container or carrier and a load lock chamber with a controllable environment as they await further transfer to a processing station. Throughput of the manufacturing process is thereby significantly increased.

Throughout this disclosure, the term "wafer" will be used for purposes of consistency to refer to planar substrates such as silicon wafers and glass flat panels, but it will be understood that it is intended to be used in the broad context so as to be applicable to all substrates. Typically, such substrates are circular and have a diameter of 200 mm and a thickness of approximately 0.760 mm although, more recently, the diameter of choice has evolved to 300 mm with the same thickness.

2. Description of the Prior Art

Control of particulate contamination is imperative for cost effective, high-yielding and profitable manufacturing of VLSI circuits. Because design rules increasingly call for smaller and smaller lines and spaces, it is necessary to exert greater and greater control on the number of particles and to remove particles with smaller and smaller diameters.

Some contamination particles cause incomplete etching in spaces between lines, thus leading to an unwanted electrical bridge. In addition to such physical defects, other contamination particles may cause electrical failure due to induced ionization or trapping centers in gate dielectrics or junctions.

The main sources of particulate contamination are personnel, equipment, and chemicals. Particles given off by personnel are transmitted through the environment and through physical contact or migration onto the wafer surface. People, by shedding of skin flakes, for example, are a significant source of particles that are easily ionized and cause defects.

Modern processing equipment must be concerned with particle sizes which range from below 0.01 micrometers to above 200 micrometers. Particles with these sizes can be very damaging in semiconductor processing. Typical semiconductor processes today employ geometries which are 1 micrometer and under. Unwanted contamination particles which have geometries measuring greater than 0.1 micrometer substantially interfere with 1 micrometer geometry semiconductor devices. The trend, of course, is to have smaller and smaller semiconductor processing geometries.

In the recent past, "clean rooms" were established in which through filtering and other techniques, attempts were made to remove particles having geometries of 0.03 micrometer and above. There is a need, however, to improve the processing environment. The conventional "clean room" cannot be maintained as particle free as desired. It is virtually impossible to maintain conventional clean rooms free of particles of a 0.01 micrometer size and below. Although clean room garments reduce particle emissions, they do not fully contain the emissions. It has been found that as many as 6000 particles per minute are emitted into an adjacent one cubic foot of space by a fully suited operator.

To control contamination particles, the trend in the industry is to build more elaborate (and expensive) clean rooms with HEPA and ULPA recirculating air systems. Filter efficiencies of 99.999% and up to ten complete air exchanges per minute are required to obtain an acceptable level of cleanliness.

Particles within the equipment and chemicals are termed "process defects." To minimize process defects, processing equipment manufacturers must prevent machine generated particles from reaching the wafers, and suppliers of gases and liquid chemicals must deliver cleaner products. Most important, a system must be designed that will effectively isolate wafers from particles during storage, transport and transfer into processing equipment. The Standard Mechanical Interface (SMIF) system has been devised, and used, to reduce particle contamination by significantly reducing particle fluxes onto wafers. This end is accomplished by mechanically ensuring that during transport, storage and processing of the wafers, the gaseous media (such as air or nitrogen) surrounding the wafers is essentially stationary relative to the wafers and by ensuring that particles from the ambient outside environment do not enter the immediate internal wafer environment.

The SMIF concept is based on the realization that a small volume of still, particle-free air, with no internal source of particles, is the cleanest possible environment for wafers.

A typical SMIF system utilizes (1) minimum volume, dustproof boxes or carriers for storing and transporting (2) open rack wafer cassettes, and (3) doors on the boxes or carriers designed to mate with doors on the interface ports on the processing equipment and the two doors being opened simultaneously so that particles which may have been on the external door surfaces are trapped ("sandwiched") between the doors.

In a typical SMIF system, a box or carrier is placed at the interface port and latches release the box door and the port door simultaneously. A mechanical elevator lowers the two doors, with the cassette riding on top. A manipulator picks up the cassette and places it onto the cassette port/elevator of the equipment. After processing, the reverse operation takes place.

SMIF systems have proved to be effective and this fact has been shown by experiments using SMIF components both inside and outside a clean room. The SMIF configuration achieved a ten-fold improvement over the conventional handling of open cassettes inside the clean room.

Using SMIF systems, it has been customary to carry a large number of the wafers within the box or carrier by supporting them in a spaced relationship by means of a cassette. Using this technique, the cassette is loaded with a supply of wafers, transported into the box or carrier, then subsequently wafers are removed from the cassette in the carrier one by one for placement into a reception chamber at the site of further processing. More recently, the cassette is being replaced with yet more efficient devices for rapidly transporting multiple wafers at a time in a particle free environment.

It was in light of the foregoing state of the art that the present invention has been conceived and is now reduced to practice. Specifically, the invention results from efforts to provide a simpler and more compact construction, reduce the cost of maintenance, and increase throughput of processed items. Much of the foregoing narrative has related to SMIF systems and the like for controlling the atmosphere within which the wafers reside during their handling operations. However, it will be appreciated that the invention herein is broadly directed to the material handling aspects of such systems without particular regard, necessarily, to the environment to which the wafers are exposed.

SUMMARY OF THE INVENTION

According to the invention, then, a system is provided for batch loading semiconductor wafers into a load lock from a portable carrier, for example, used for supporting and transporting a plurality of the wafers in spaced, stacked, relationship. For such an arrangement, the carrier is supported adjacent a chamber within the load lock. A multilevel end effector associated with the load lock chamber includes a plurality of spaced end effector sets, each set being adapted to support a wafer thereon and aligned with an associated wafer supported in the carrier. The plurality of wafers are engaged and simultaneously retrieved as a grouping, then held in the load lock chamber for subsequent transport, for example, one at a time, into an adjacent transport chamber for delivery to a specified one of a plurality of processing stations. An isolation housing or mini-environment sealingly isolates the load lock chamber and the interior of the carrier from the surrounding atmosphere. Mechanisms are provided for moving the end effector sets, both elevationally and into and out of the carrier and load lock chamber, and for moving a carrier door and a load lock door between a closed, sealed, position and an open position and to a parked position remote from the region adjacent the load lock chamber.

The invention serves to interface a wafer carrier directly to the load lock while maintaining the clean environment of the substrate carrier, if desired. No elevator is needed in the transfer of wafers since the load lock arm has a batch end effector which acts as a cassette in the load lock, yet has none of the constraints inherent in a cassette construction.

The invention results in a construction by reason of which the purposes of the carrier and cassette are unified while eliminating the need for a cassette and the inventory which is undesirably associated with the use of cassettes. Wafers are loaded in a batch configuration which reduces overhead time and results in higher tool throughput.

Other and further features, advantages, and benefits of the invention will become apparent in the following description taken in conjunction with the following drawings. It is to be understood that the foregoing general description and the following detailed description are exemplary and explanatory but are not to be restrictive of the invention. The accompanying drawings which are incorporated in and constitute a part of this invention, illustrate one of the embodiments of the invention, and, together with the description, serve to explain the principles of the invention in general terms. Like numerals refer to like parts throughout the disclosure.

DETAILED DESCRIPTION OF THE PREFERRED EMBODIMENTS

Figure 1:
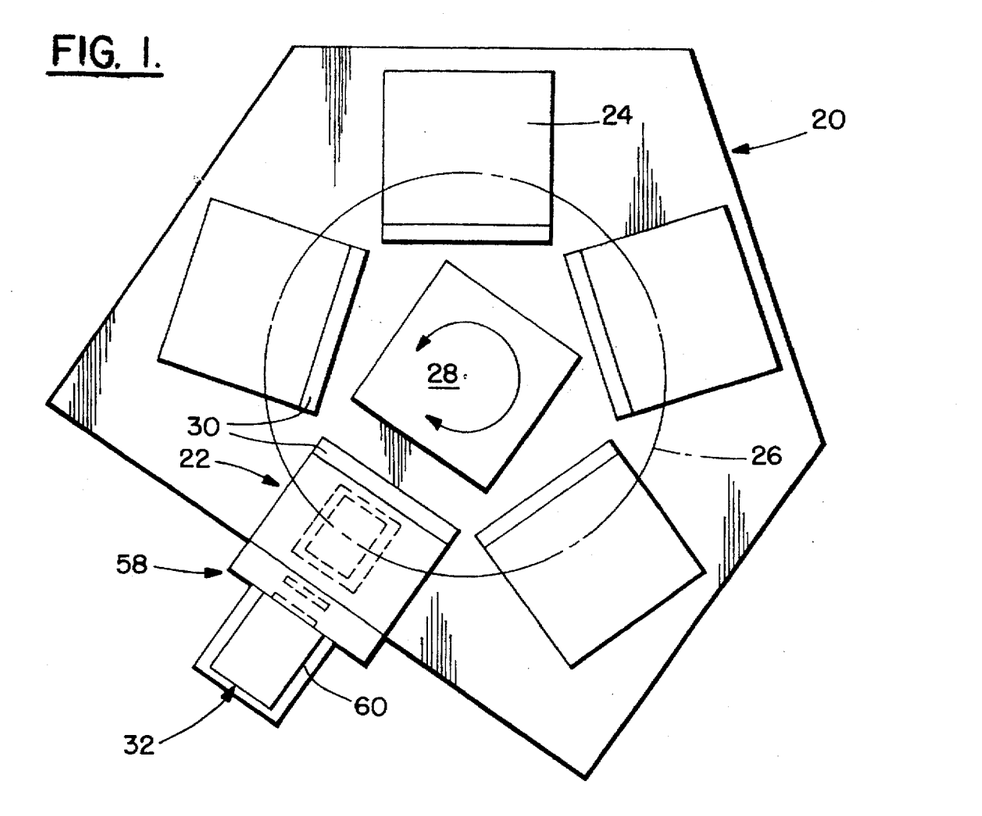
FIG. 1 is a top plan diagrammatic view of a wafer processing system embodying the present invention, with the cover removed from the transport chamber.

Turn now to the drawings and, initially, to FIG. 1 which illustrates a processing system 20 for operating on silicon planar substrates such as wafers and flat panels. As noted above, throughout the remainder of this disclosure, the term "wafer" will be used for purposes of consistency to refer to such substrates, but it will be understood that it is intended to be used in the broad context so as to be applicable to all substrates. The invention is especially beneficial for operating on the newer size of substrates.

The processing system 20 includes a load lock 22 for initially receiving wafers to be processed and a plurality of single-wafer processing stations 24 for operations on the surfaces of the wafers such as imaging, plasma etching, and the like. It is typical for the processing stations 24 to be arranged about a closed locus as indicated by a dashed line 26. A transport chamber 28 is disposed concentrically within the load lock 22 and processing stations 24 for singly transferring wafers to be processed and after processing between the load lock and one or more of the processing stations 24. A plurality of isolation valves 30 are individually provided at the interfaces of the several processing stations 24 and the transport chamber 28 and between the load lock 22 and the transport chamber 28.

As previously noted, for some time now, it has been known to employ transportable SMIF boxes or containers, herein referred to as "carriers", for maintaining articles, such as semiconductor wafers, clean. This has been achieved by maintaining within each carrier a substantially particle free environment while the wafers are being brought to, or removed from, the processing system 20. Previously, it was customary to carry a large number of the wafers within the carrier by supporting them in a spaced relationship by means of a cassette (not shown). Using this technique, the cassette would be loaded with a supply of wafers, transported into the carrier, then subsequently wafers would be removed from the cassette within the carrier one by one for placement in the load lock 22 or the cassette would be transferred with the wafers within the clean mini-environment existing between the carrier, SMIF box, or the like, and the wafer processing equipment.

Figures 2, 12:
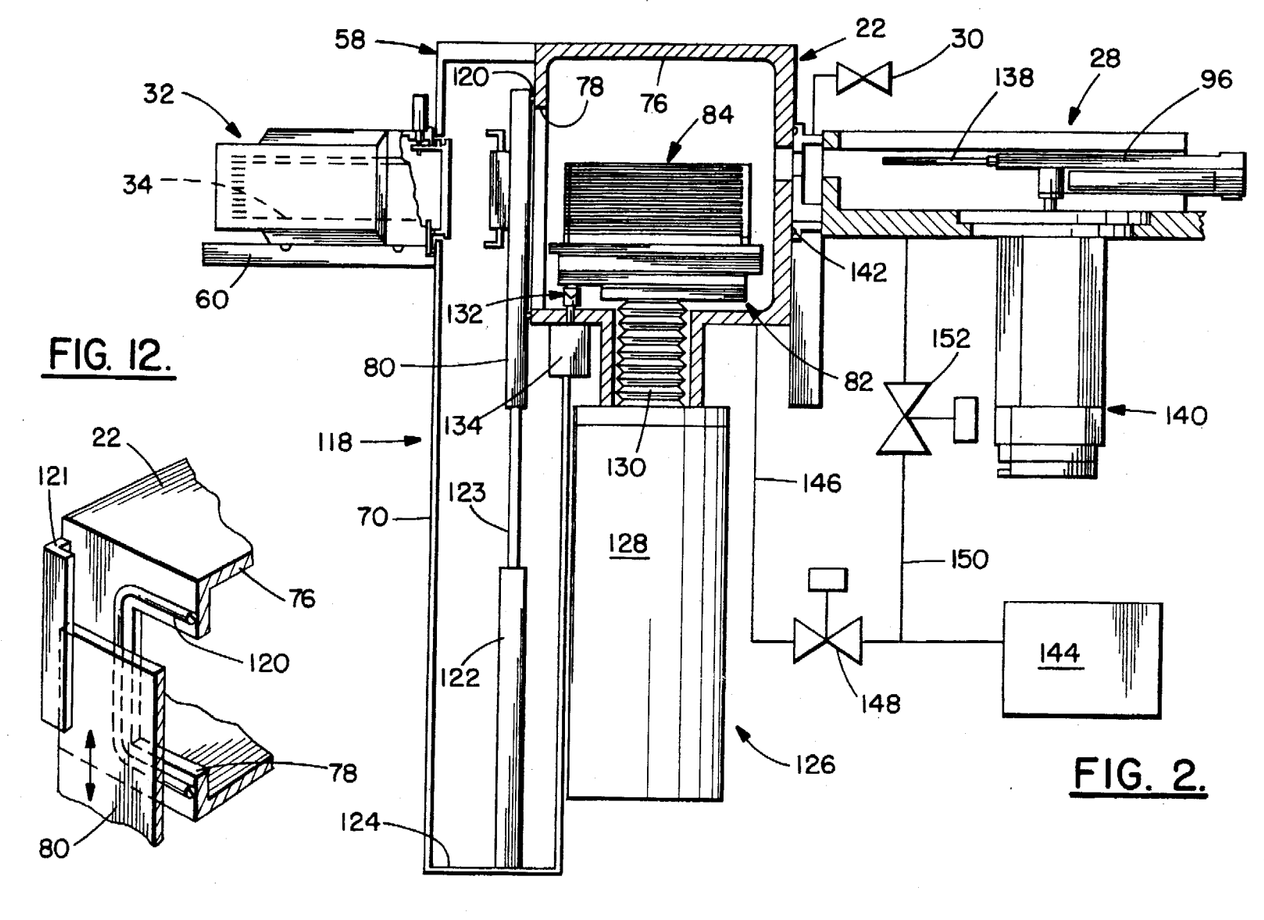
FIG. 2 is a diagrammatic side elevation view, certain parts being shown in section for clarity, illustrating in greater detail certain components illustrated in FIG. 1.
FIG. 12 is a detail perspective view illustrating in much greater detail components illustrated in FIG. 2.
Figures 3, 3A:
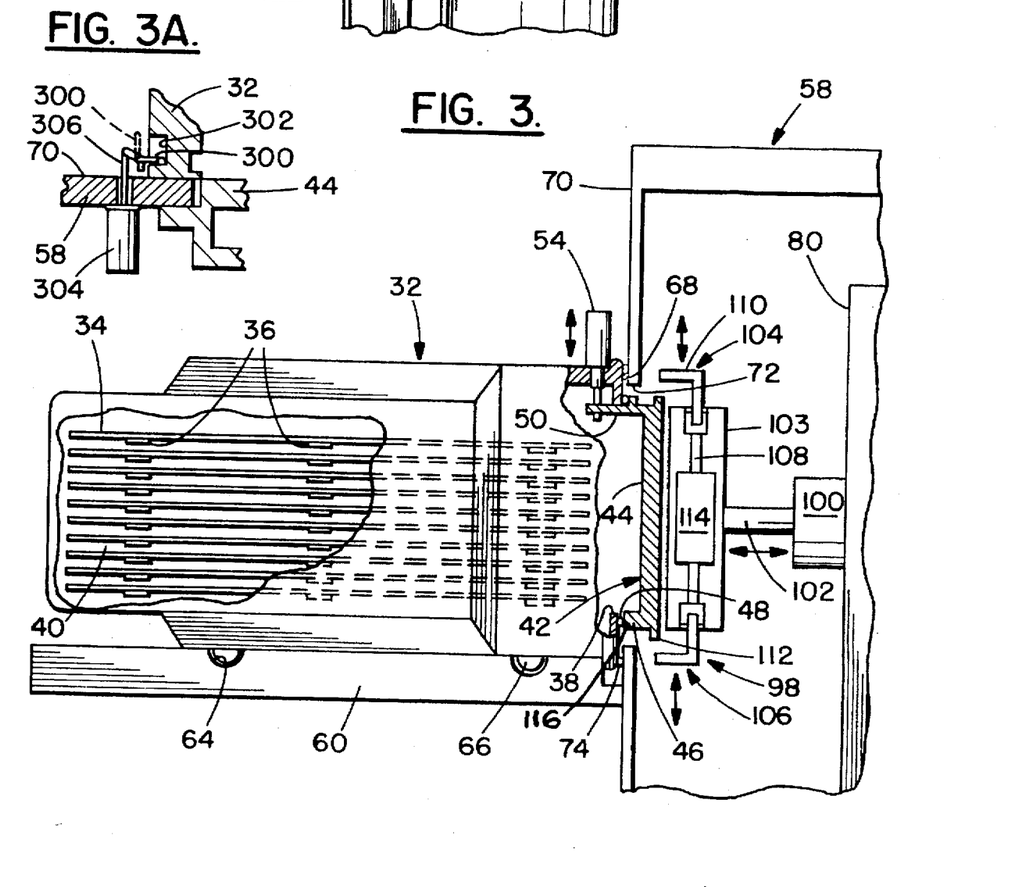
FIG. 3 is a diagrammatic detail side elevation view, certain parts being cut away and/or shown in section for clarity, illustrating in greater detail certain components illustrated in FIG. 2 and indicating the carrier door in its closed position.
FIG. 3A is a detail cross section view illustrating a small portion of FIG. 3.

According to the invention, turning now to FIGS. 2 and 3, a modified portable carrier 32 is provided for supporting and transporting a plurality of wafers 34 in spaced relationship in a substantially particle free environment. The carrier 32 has a plurality of rack member sets 36 for supporting the wafers generally horizontally, in a generally vertically spaced relationship.

The carrier 32 includes a carrier port 38 for providing access to the interior 40 thereof. A carrier door 42 on the carrier is movable between a closed position (FIG. 3) overlying the carrier port and an open position (FIG. 4) spaced from the carrier port. The carrier door 42 is illustrated as including a generally rectangular plate 44 and has a peripherally extending continuous transverse flange 46. A suitable seal 48 is interposed between the flange 46 and the carrier port 38 for sealing the interior 40 of the carrier from the surrounding atmosphere when the carrier door is in the closed position.

Figure 5:
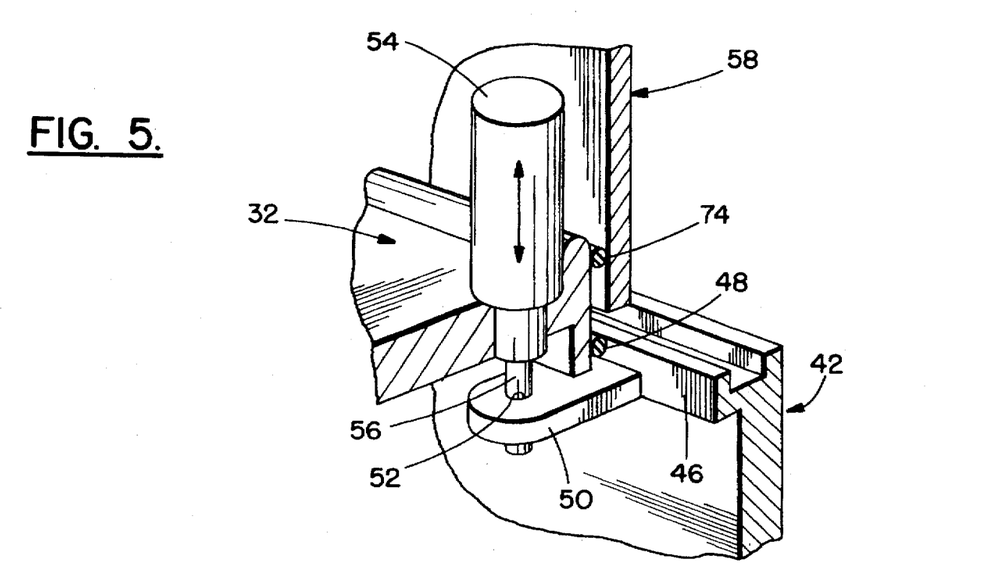
FIG. 5 is a detail perspective view, certain parts being shown in section for clarity, illustrating in much greater detail components illustrated in FIG. 3.

At least a pair of opposed locking tabs 50 extend in a direction toward the carrier 32 from the flange 46 and each locking tab has a hole 52 therethrough. Associated with each of the locking tabs 50 is a locking member 54 which may be in the form of a solenoid for operating a locking pin 56. Viewing especially FIG. 5, the locking member is suitably mounted on the carrier 32. When the locking pins 56 are engaged with their associated holes 52, the carrier door 42 is held closed with the flange 46 bearing firmly against the carrier port 38 with the seal 48 interposed between the flange and the port to maintain the particle free environment within the interior 40 of the carrier. When the locking pins 56 are withdrawn from their associated holes 52, the carrier door 42 is then free to be removed from the carrier in a manner to be described below.

Also, according to the invention, an isolation housing or mini-environment 58 (see especially FIG. 2.) is provided for sealingly isolating the load lock 22 and the interior 40 of the carrier 32 from the surrounding atmosphere. The carrier is brought in some suitable fashion from a remote location, then placed on a platform 60 which is a part of the mini-environment 58 and projects in a direction away from the processing system 20. An upper surface 62 of the platform 60 is formed with a plurality of depressions 64 properly spaced to receive feet 66 which project from the bottom of the carrier. When the feet 66 are fully engaged with the depressions 64, a front surface 68 of the carrier 32 is proximate an outer surface 70 of the mini-environment 58.

The mini-environment has an aperture 72 which is generally aligned with the load lock 22 but spaced therefrom and when the carrier is seated on the platform 60, the carrier door 42 projects through the aperture into the interior of the mini-environment. A suitable seal 74 is provided between the mini-environment 58 and the carrier when supported on the platform and encompasses the carrier port 38 and the aperture 72 in the mini-environment for isolating the interior of the carrier, the interior of the mini-environment and the load lock from the surrounding atmosphere. With the carrier 32 positioned on the platform 60 in the manner illustrated in FIG. 3, a plurality of clamps 300 (FIG. 3A) pivotally mounted on the outer surface 70 of the mini-environment 58 may be selectively operated to engage with associated clamp recesses 302 provided in the outer peripheral surface of the carrier. In each instance, a clamp actuator 304 extends or retracts an actuator rod 306 which is pivotally attached to the clamp 300 at an end distant from the part engaging the recess 302. On signal, the clamp actuator 304 is effective to move the clamp 300 from the solid line position engaging the recess 302 to a broken line position disengaged from the recess. When all of the clamps 300 for the carrier 32 assume the solid line position, the seal 74 is compressed tightly between the carrier and the mini-environment.

The load lock 22 defines a chamber 76 therein having a substantially particle free environment and includes a load lock port 78 opening into the load lock chamber. As noted previously, the load lock 22 is positioned intermediate the carrier 32 and the transport chamber 28. A load lock door 80 is suitably mounted on the load lock for movement between a closed position overlying the load lock port 78 and an open position spaced therefrom.

A load lock arm 82 within the load lock chamber 76 is movable between an inactive position distant from the carrier 32 (see FIG. 2) and an active position proximate the carrier (see FIG. 3). The load lock arm and its operating mechanism may be of the construction disclosed in commonly assigned and copending application Ser. No. 08/498, 835 filed Jul. 6, 1995 entitled "Load Arm for Load Lock", the disclosure of which is incorporated herein in its entirety, by reference.

Figure 4:
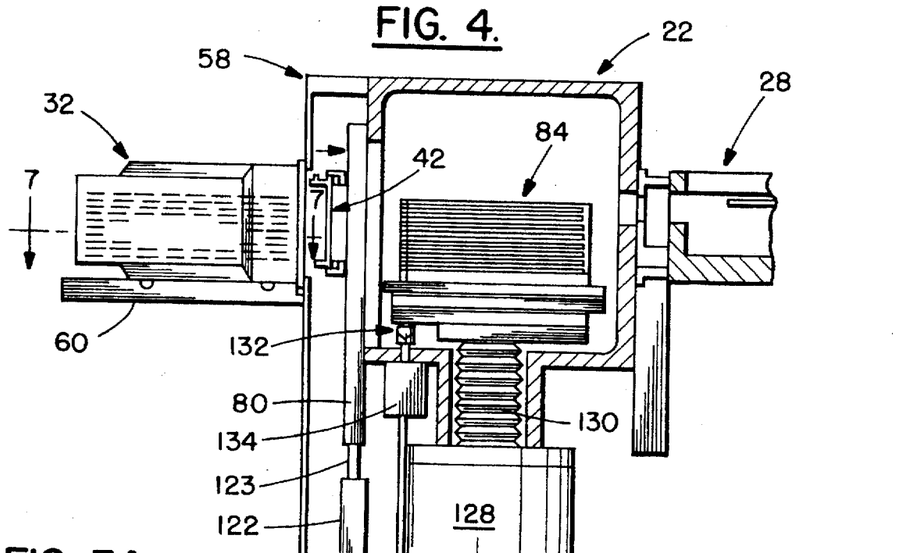
FIG. 4 is a diagrammatic side elevation view illustrating a portion of FIG. 2 but indicating the carrier door in its open position.
Figures 6, 7:
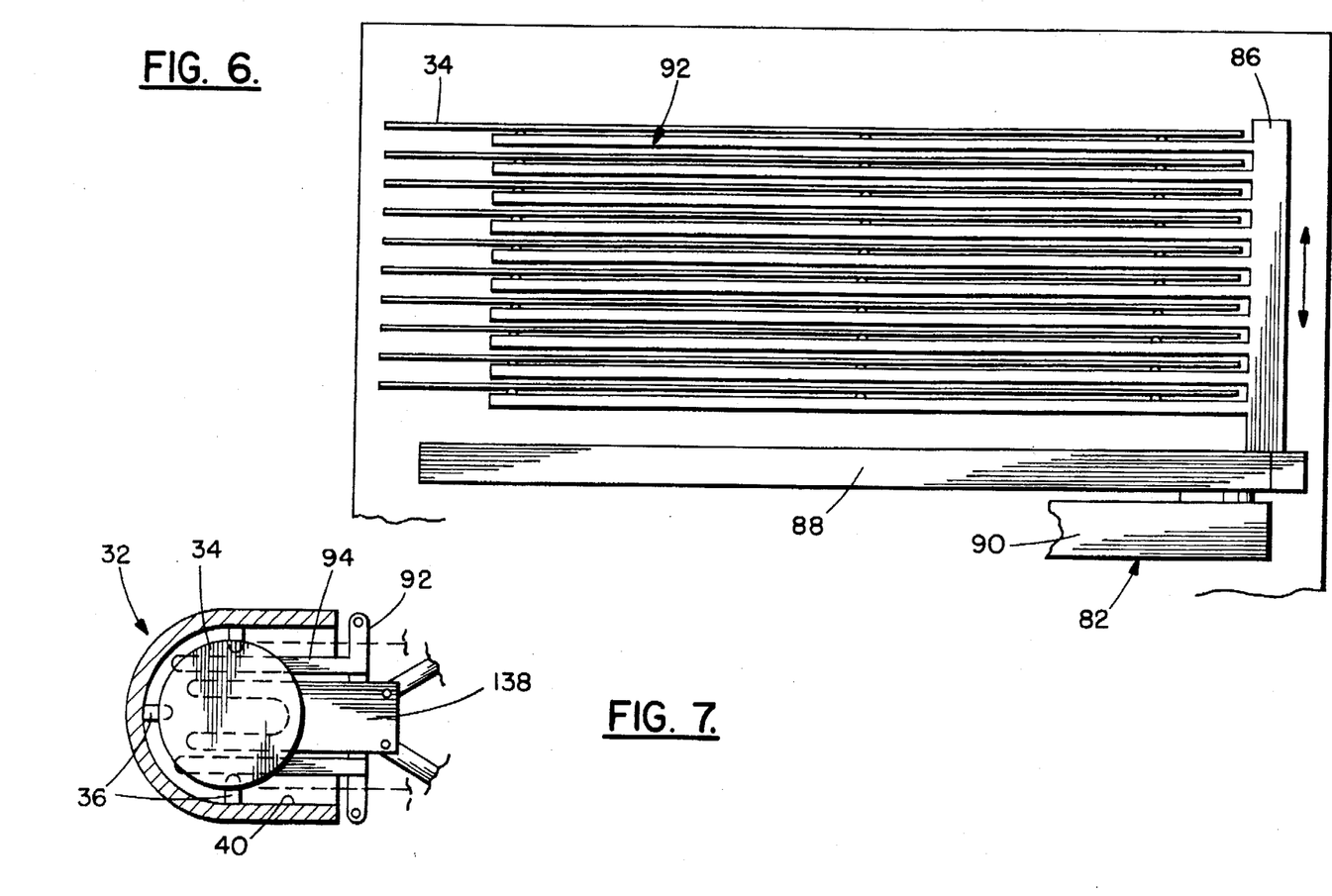
FIG. 6 is a detail side elevation view illustrating a part of FIG. 2.
FIG. 7 is a cross section view taken generally along line 7—7 in FIG. 4.

With continuing reference to FIGS. 3 and 4, and with new reference to FIG. 6, a multilevel end effector 84 is mounted on the load lock arm 82. As seen more clearly in FIG. 6, the multilevel end effector 84 includes a mounting manifold 86 which is suitably mounted on and projects upwardly from the load lock arm 82 and, more specifically, from an elongated joint 88 of an articulated pair of such joints 88, 90 pivotally mounted on the load lock arm. A plurality of vertically spaced end effector sets 92 are integral with the mounting manifold and project outwardly from the mounting manifold in the direction of the carrier and lie in equally spaced parallel planes.

Figure 8:
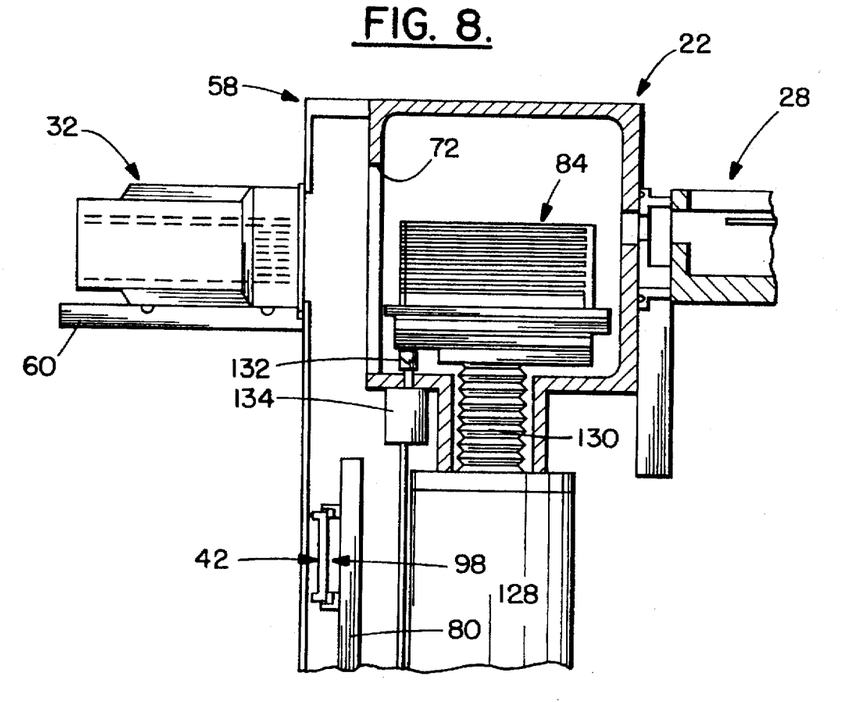
FIGS. 8, 9, 10, and 11 are diagrammatic side elevation views, similar to FIG. 4 but illustrating successive relative positions of the components thereof.

The spacing between the end effector sets 92 is substantially greater than the thickness of a wafer 34 for reasons which will become clear as this description proceeds. Each end effector set 92 includes a pair of parallel laterally spaced end effector fingers 94 (see FIG. 7) which together are adapted to support a wafer in a generally horizontal plane. Each of the plurality of spaced end effector sets 92 is aligned with one of the rack member sets 36 when the load arm is in the active position and, therefore, with an associated wafer 34 supported in the carrier. In order for movement of the multilevel end effector 84 toward and into the carrier 32 to commence in the manner about to be described, the load lock door 80 and the carrier door 42 must both be opened and moved to a remote location as seen in FIG. 8.

Figure 9:
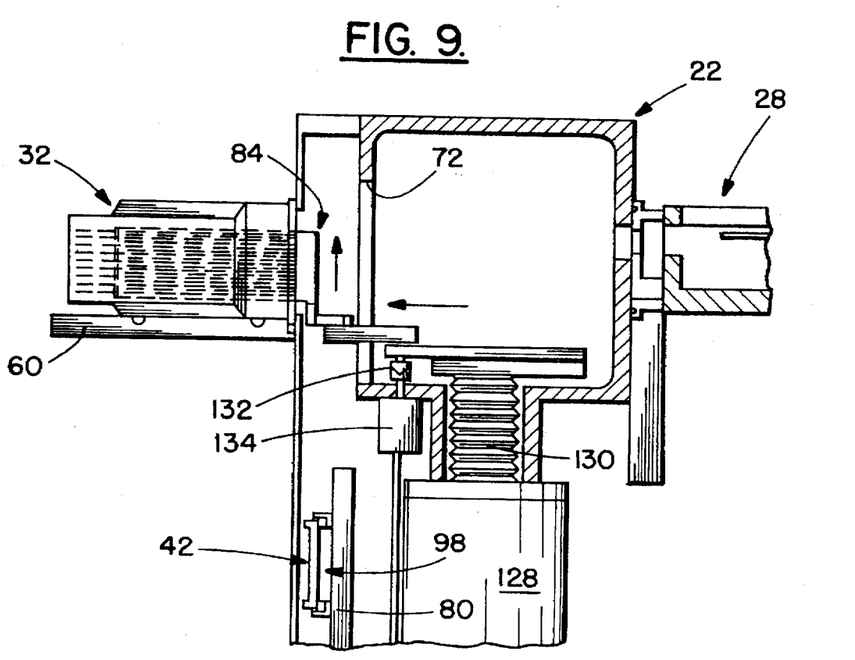
Figure 11:
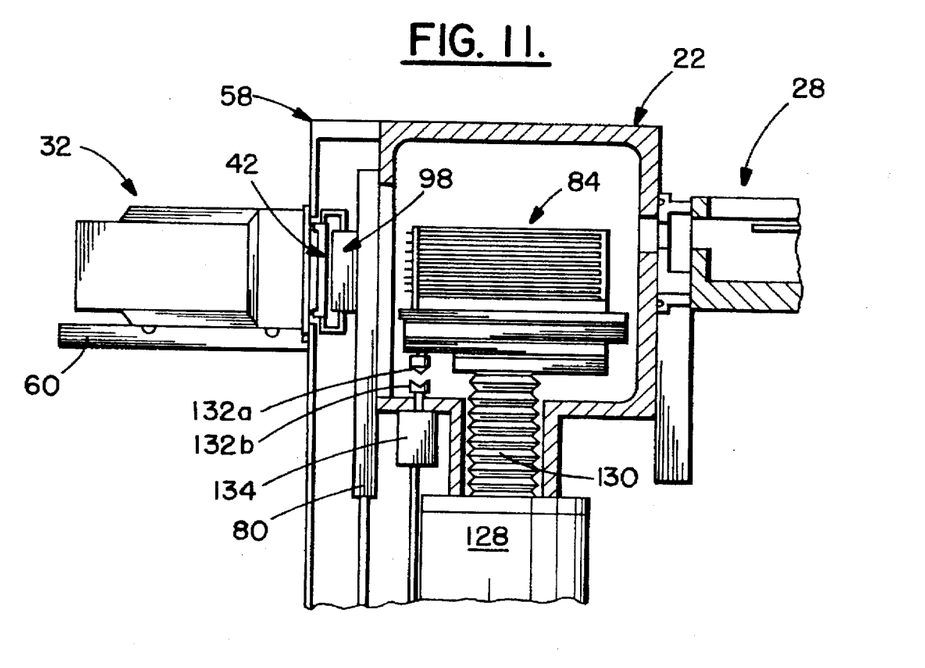

The multilevel end effector 84 is then movable, when the load lock arm 82 is in the active position, from a retracted position distant from the wafers to an advanced position within the interior 40 of the carrier 32 and extending through the load lock port 78 and through the carrier port 38 for engaging and simultaneously retrieving the wafers as a grouping. The load lock arm 82 is operated in such a manner as to proceed to move the multilevel end effector 84 to the left (FIG. 9) with each of the end effector sets 92 advancing beneath and out of engagement with its associated wafer 34. When the multilevel end effector 84 reaches its extreme leftward movement, the load lock arm, and with it the multilevel end effector 84, is raised a sufficient distance to lift the wafers, as a grouping, off their associated spaced rack member sets. Thereupon, while retaining that elevated positioning, the load lock arm 82 is again operated, this time in such a manner as to move the multilevel end effector 84 to the right, to the retracted position, for holding the grouping of the wafers 34 on the multilevel end effector 84 in the load lock chamber 76. See FIG. 11.

After the grouping of the wafers 34 is so positioned on the multilevel end effector 84 in the load lock chamber 76, a transport arm 96 within the transport chamber 28 may be operated for retrieving the wafers 34, one at a time, from the multilevel end effector and delivering it to a specified one of the plurality of processing stations 24.

In order to operate the multilevel end effector 84 in the manner just described, it is necessary first to coordinate the opening of the carrier door 42 and of the load lock door 80. The mechanism for achieving this coordinated operation will now be described. Initially, the carrier door is opened, then the load lock door is opened, then both doors together are moved to a location remote from the region between the interior of the carrier and the load lock chamber.

The carrier door drive mechanism includes a coupling device 98 which is selectively engageable with the carrier door 42 and movable between a first position (FIG. 2) remote from the carrier door and adjacent the load lock door 80 and a second position (FIG. 3) adjacent the carrier door and remote from the load lock door. A first actuator 100 is mounted on the carrier door and, via a drive rod 102, serves to move the coupling device 98 between the first and second positions. The coupling device includes a coupler frame 103 mounted on the drive rod and a pair of opposed axially aligned gripper members 104, 106 supported on and guided by the coupler frame. The gripper members 104, 106 include opposed axially aligned gripper rods 108 which are supported on and guided by the coupler frame 103 for movement between non-gripping positions and the gripping positions. Specifically, each gripper member 104,106 has a transverse gripper finger 110 at its terminal end, the gripper fingers being engaged with a peripheral rim 112 of the carrier door 42 when the gripper members are in their gripping positions.

Thus, the gripper fingers are movable between non-gripping positions (FIG. 2) free of engagement with the carrier door 42 and gripping positions (FIG. 4) in gripping engagement with the peripheral rim 112. Such gripping engagement of the carrier door by the gripper members 104, 106 can only occur when the coupling device 98 is in the second position. A second actuator 114 on the coupler frame 103 serves to move the gripper members 104, 106 between the non-gripping positions and the gripping positions via the suitably constrained gripper rods 108.

Proceeding through the operational sequence for opening the carrier door 42, operation of the first actuator 100 is initiated to move the coupling device 98 to the left to a location proximate the carrier door such that the gripper fingers 110 lie within the plane of the peripheral rim 112. Thereupon, operation of the second actuator 114 is initiated to move the gripping members radially until the gripping fingers firmly engage the peripheral rim 112.

Thereupon, the first actuator 100 is again operated, this time to move the coupling device toward the right thereby causing an extremity 116 of the inwardly directed flange 46 to withdraw from the seal 48 which had, until now, maintained an environment isolated from the surrounding atmosphere. By means of the drive rod 102, the coupling device 98 and, with it, the carrier door 42 are moved to the right to a position adjacent the load lock door 80.

With the carrier door 42 so positioned adjacent the load lock door 80, a load lock door drive mechanism 118 is then operated for moving the load lock door and, with it, the unit comprising the coupling device 98 and the carrier door 42 from the closed position to the open position. In the closed position, the load lock door 80 is held firmly against a suitable seal 120 interposed between the load lock door and the load lock 22 for isolating the load lock chamber 76 from the atmosphere (see FIGS. 2 and 12). This may be achieved, for example, by means of spaced, opposed, generally vertically oriented guide channels 121 integral with the load lock 22 and provided on opposite sides of the load lock door 80.

The load lock door drive mechanism 118 includes a drive actuator 122 mounted on a base 124 of the mini-environment 58. The drive actuator 122 is vertically disposed with a drive actuator shaft 123 suitably attached to the load lock door 80 to move it between its raised closed position and a lowered open position remote from the region intermediate the carrier and the load lock chamber 76.

It will be appreciated that operation of the multilevel end effector 84 cannot be achieved until the drive mechanism 118 has been operated to move the load lock door, the coupling device 98, and the carrier door 42 all to the lowered position as indicated in FIG. 8.

Figure 10:
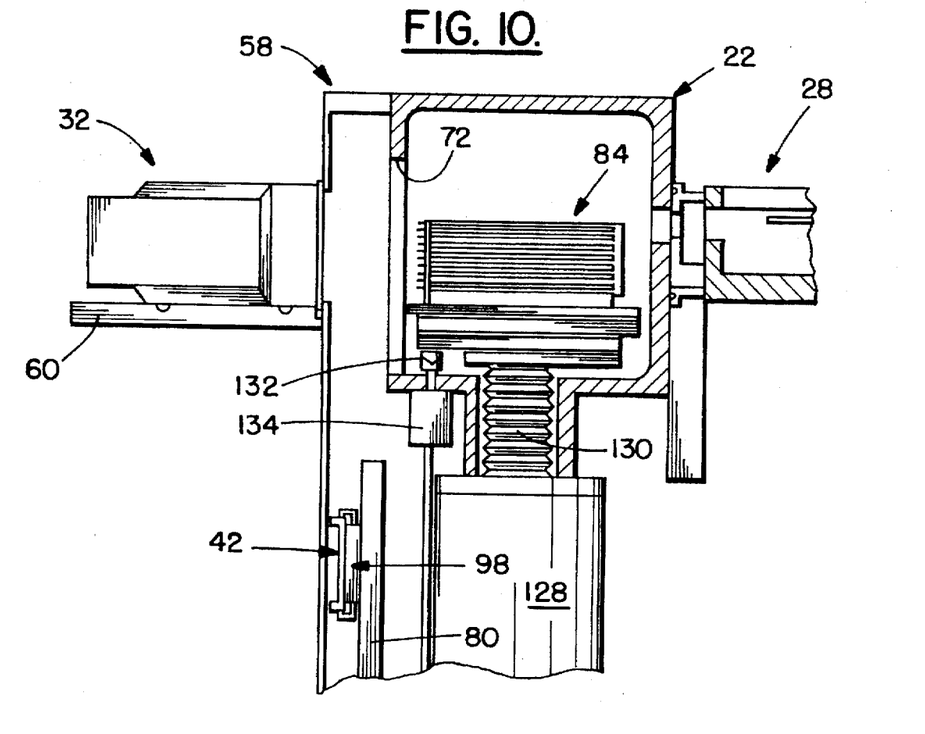

An index drive mechanism 126 is provided for moving the load lock arm between the inactive position (FIG. 11) and the active position (FIG. 10). As previously mentioned, the load lock arm 82 and its operating mechanism, herein the index drive mechanism 126, may be of the construction disclosed in commonly assigned and copending application Ser. No. 08/498,835 filed Jul. 6, 1995.

The index drive mechanism 126 includes a suitable index actuator 128 which is of the type which can advance an index actuator shaft 130, as desired, either in a macro fashion rapidly over a relatively long distance or in a micro fashion, that is, in incremental steps. Thus, the index actuator, in one mode of operation, can move the load lock arm between an active position (FIGS. 8–10) at which all of the end effector sets 92 are aligned with their associated rack member sets 36 in the interior 40 of the carrier 42 and an inactive position (FIG. 11) at which all of the end effector sets are not so aligned with their associated rack member sets. In the former instance, a clutch 132 is engaged; in the latter instance, the clutch is disengaged.

An arm drive mechanism 134 includes a suitable rotary actuator for moving the load lock arm 82 and, with it, the multilevel end effector 84 between the retracted and advanced positions. The arm drive mechanism 134 further includes engageable clutch elements 132a and 132b which only engage when the index drive mechanism moves the load lock arm and the multilevel end effector to the active position. When that occurs, the end effector 84 can be advanced into the interior of the carrier as previously described.

It was previously mentioned that a transport arm 96 within the transport chamber 28 may be operated for retrieving the wafers 34, one at a time, from the multilevel end effector and delivering it to a specified one of the plurality of processing stations 24. The index drive mechanism 126 may also be operated in its incremental mode to adjust the level of a particular end effector set 92 with robot end effector fingers 138 on the transport arm 96 within the transport chamber 28. In this manner, with the clutch elements 132a, 132b disengaged, the transport arm 96 driven by a transport actuator 140 is effective to retrieve wafers one at a time from the multilevel end effector 84 for delivery to a specified one of the processing stations 24. The transport arm 96 and its associated transport actuator 140 may be of the construction disclosed in commonly assigned U.S. Pat. No. 5,180,276 to Hendrickson, the disclosure of which is incorporated herein in it entirety, by reference.

A suitable isolation valve 30, previously mentioned, is provided intermediate the load lock chamber 76 and the transport chamber 28. The isolation valve is sufficiently large to permit passage therethrough of the robot end effector fingers supporting a wafer 34 and is selectively operable to permit fluid intercommunication between the load lock chamber and the transport chamber in one instance and to prevent fluid intercommunication therebetween. Of course, failure to permit fluid intercommunication between the chambers also results in prevention of passage therethrough of the robot end effector fingers supporting a wafer 34. Additionally, a suitable seal 142 is interposed between the load lock 22 and the transport chamber 28 for isolating the load lock and the transport chamber from the surrounding atmosphere when the isolation valve is positioned to permit fluid intercommunication between the load lock chamber and the transport chamber.

A source of vacuum 144 is provided for selectively evacuating the load lock chamber 76 and the transport chamber 28. A conduit 146 extends between the source of vacuum 144 and the load lock chamber and a selectively operable valve 148 in the conduit 146 interconnects the vacuum source and the load lock chamber 76 when the load lock door 80 is closed and disconnects the vacuum source from the load lock chamber when the load lock door is open. In a similar manner, a conduit 150 extends between the source of vacuum 144 and the transport chamber. A selectively operable valve 152 in the conduit 150 interconnects the vacuum source and the transport chamber when the transport chamber is isolated from the surrounding atmosphere.

Figure 13:
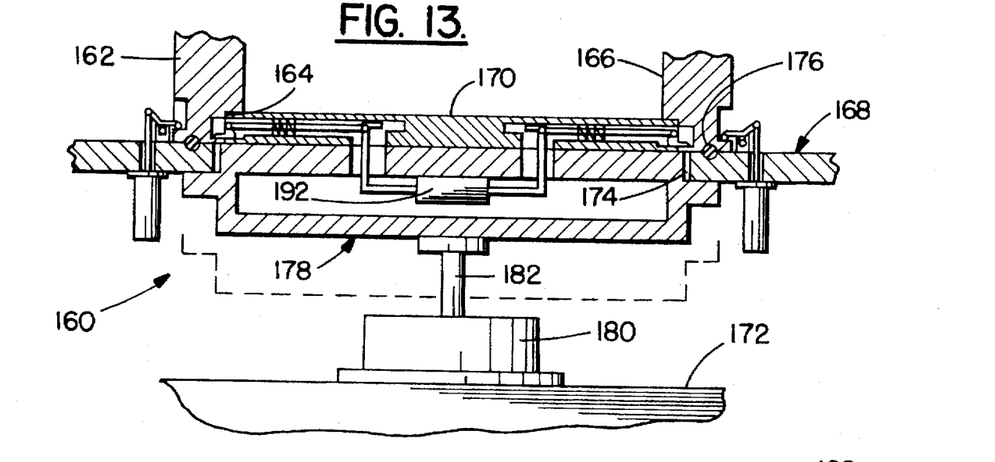
FIG. 13 is a detail top plan view, largely in cross section, illustrating another embodiment of the invention.
Figure 14:
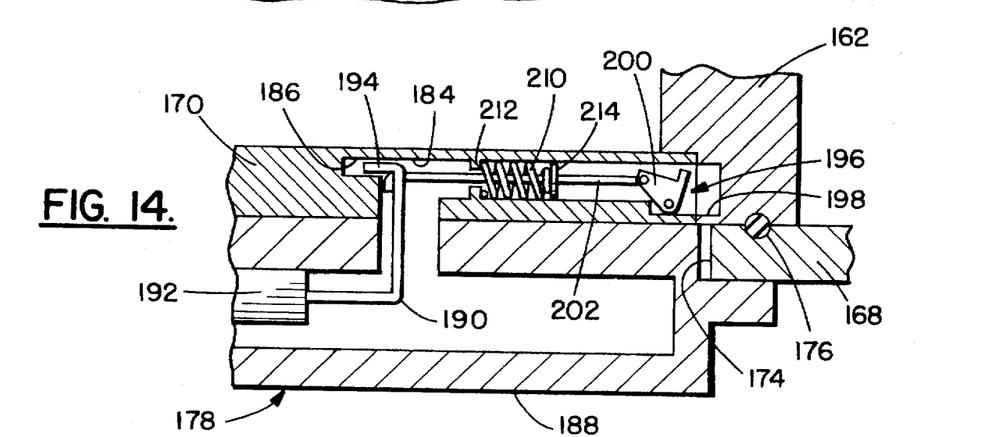
FIG. 14 is a further detail top plan view, in cross section, illustrating a part of FIG. 13 in greater detail and illustrating components thereof in another position.
Figure 15:
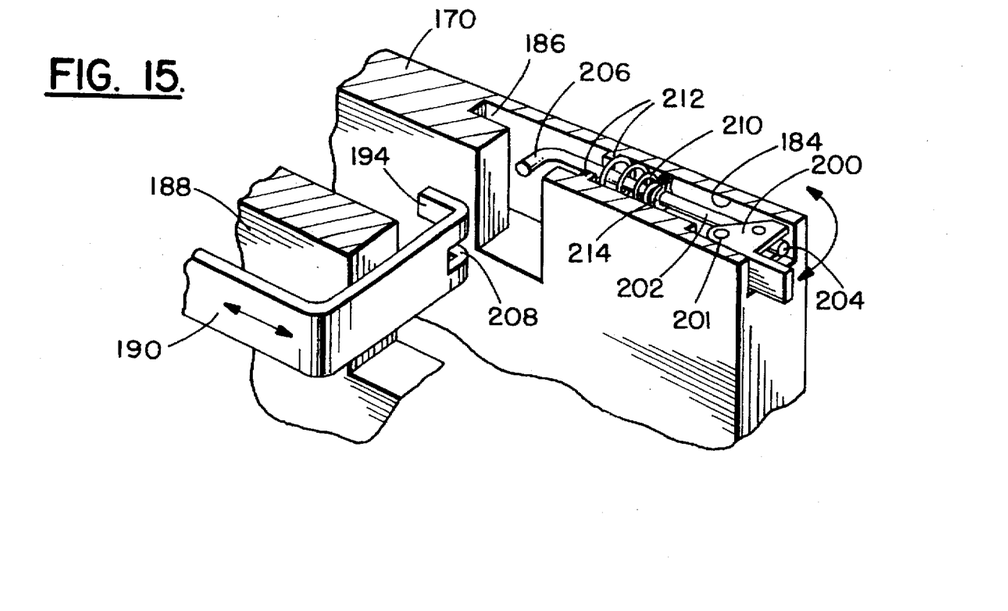
FIG. 15 is a detail perspective view of parts illustrated in FIG. 14, certain parts being cut away and shown in section.

Turn now to FIGS. 13–15 for a description of another, and preferred, embodiment of the invention, namely, carrier door drive mechanism 160. In this instance, a carrier 162 is similar to the carrier 32 previously described for supporting and transporting a plurality of wafers 34 in spaced generally stacked relationship. As before, the carrier 162 has a carrier port 164 for providing access to its interior 166. Again, there is a mini-environment 168 for sealingly isolating the load lock chamber and the interior of the carrier from the surrounding atmosphere. Again, the carrier 162 includes a carrier door 170 which is movable between a closed position overlying the carrier port 164 for sealing the interior 166 from the surrounding atmosphere and an open position spaced from the carrier port.

A load lock door 172 on the load lock is movable in the manner previously described between a closed position overlying the load lock port for sealing the load lock chamber from the surrounding atmosphere and an open position spaced therefrom. The carrier door drive mechanism and its operation are also as previously described.

The mini-environment 168 has an aperture generally aligned with the load lock port but spaced therefrom and includes the platform 60 for supporting the carrier 162 thereon such that the carrier port 164 is proximate the aperture 174 in the mini-environment. A suitable seal 176 is provided between the mini-environment and the carrier when the carrier is supported on the platform and encompasses the carrier port and the aperture in the mini-environment for isolating the interior of the carrier, the interior of the mini-environment and the load lock chamber from the surrounding atmosphere.

The carrier door drive mechanism 160 includes a coupling mechanism 178 which is selectively engageable with the carrier door 170 and movable between a first position remote from the carrier door and adjacent the load lock door and (as depicted by broken lines in FIG. 13) and a second position adjacent the carrier door and remote from the load lock door (as depicted by solid lines in FIG. 13). A first actuator 180 is mounted on the load lock door 172 and includes a drive rod 182 for moving the coupling mechanism 178 between the first and second positions.

The carrier door 170 is recessed as at 184 (FIGS. 14 and 15) and has a gripper slot 186 therein. The coupling mechanism 178 includes a door gripper plate 188 mounted on the drive rod 182 and matingly receivable with the carrier port 164 when the coupling mechanism is in the second position as mentioned earlier. A door gripper bar 190 on a second actuator 192 which, in turn, is mounted on the door gripper plate 188 has a pair of bent fingers 194 at a distal end thereof movable between a gripping position grippingly engaging the gripper slot 186 in the carrier door 170 and a release position disengaged therefrom.

Additionally, a latch mechanism 196 is provided on the carrier door for selective engagement with the carrier for securely attaching the carrier door to the carrier. For this purpose, the carrier 162 has a latch recess 198 (FIG. 14) in the carrier port 164. Cooperating with the latch recess 198, the latch mechanism 196 includes a latch 200 pivotally mounted, as at 201, on the carrier door 170 for movement between a latching position engaged with the latch recess and an unlatching position disengaged from the latch recess. A retention pin 202 is pivotally connected to the latch at a first end 204 within the recess 184 and has a second turned end 206 opposite the first end. The turned end 206 is receivable in a slot 208 between the pair of bent fingers 194 and is engageable with the door gripper bar 190.

A compression spring 210 encircles the retention pin 202 and is suitably supported within the recess 184 for biasing the latch 200 to the latching position. At its left end (viewing FIGS. 14 and 15) the spring is seated against opposed shoulder members 212 which project into the recess from opposite walls of the recess 198 in the carrier door 170. The right end of the spring 210 bears against a c-clamp 214 fixed to the retention pin 202 an appropriate distance from the shoulder members 212. With this construction, the retention pin and its second, turned, end 206 is biased toward the right, viewing FIGS. 13–15. In this manner, the spring 210 is effective to hold the latch 200 in a normally closed position in engagement with the latch recess 198. However, the movement of the door gripper bar 190 to move the pair of bent fingers 194 into the gripping position grippingly engaging the gripper slot 186 is effective to simultaneously move the latch to the unlatching position disengaged from the latch recess. With continued operation of the actuator 192 to hold the bent fingers 194 in engagement with the gripper slot 186 and to hold the latch 200 swung in the open position (all as shown in FIG. 14), the carrier door 170 and the door gripper plate 188 operate as a unit and can be moved by the actuator 180 to the open, broken line, position indicated in FIG. 13.

While preferred embodiments of the invention have been disclosed in detail, it should be understood by those skilled in the art that various other modifications may be made to the illustrated embodiments without departing from the scope of the invention as described in the specification and defined in the appended claims.

What is claimed is:

1. A system for batch loading semiconductor wafers to and from a carrier having an interior region used for supporting and transporting in a substantially particle free environment a plurality of the wafers in spaced generally stacked relationship, said system comprising:

a transport chamber for receiving wafers for transfer to a plurality of processing stations;

a load lock defining a chamber therein having a substantially particle free environment and including a load lock port opening into the load lock chamber, said load lock positioned intermediate the carrier and said transport chamber;

a load lock door on said load lock movable between a closed position sealingly overlying said load lock port and an open position spaced therefrom;

a load lock arm within the load lock chamber movable between an inactive position distant from the carrier and an active position proximate the carrier;

a multilevel end effector on said load lock arm including a plurality of spaced end effector sets, each said end effector set adapted to support a wafer thereon, each of said plurality of spaced end effector sets being aligned with an associated wafer supported in the carrier when said load lock arm is in the active position, said multilevel end effector being movable, when said load lock arm is in the active position and when said load lock door is in the open position, from a retracted position distant from the wafers to an advanced position extending into the interior region of the carrier for engaging and simultaneously retrieving the wafers as a grouping, then again to the retracted position for holding the grouping of wafers in the load lock chamber; and a transport arm within said transport chamber for retrieving wafers one at a time from said multilevel end effector and delivering it to a specified one of the plurality of processing stations; and first selectively operable valve means between said transport chamber and said load lock for movement between an open position enabling movement therethrough of said transport arm and a wafer supported thereon and a closed position sealing said transport chamber from said load lock and preventing movement therethrough of said transport arm and a wafer supported thereon.

2. A system as set forth in claim 1 including:

an arm drive mechanism for moving said load lock arm between the inactive position and the active position; and an end effector drive mechanism for moving said multilevel end effector between the retracted and advanced positions.

3. A system as set forth in claim 2 including:

an isolation housing for sealingly isolation the load lock chamber and the interior of the carrier from the surrounding atmosphere.

4. A system as set forth in claim 1 including:

seal means between said load lock door and said load lock for isolating the load lock chamber from the surrounding atmosphere when said load lock door is in the closed position.

5. A system as set forth in claim 1 including:

a load lock door drive mechanism for moving said load lock door between the closed and open positions.

6. A system as set forth in claim 1 including:

vacuum means for selectively evacuating the load lock chamber when said load lock door is in the closed position;

a source of vacuum;

conduit means extending between said source of vacuum and the load lock chamber;

second selectively operable valve means in said conduit means for interconnecting said vacuum source and the load lock chamber when the load lock chamber is isolated from the surrounding atmosphere.

7. A system as set forth in claim 1 including:

arm drive means for moving said load lock arm between the active position and the inactive position.

8. A system for handling semiconductor wafers as set forth in claim 7, wherein said arm drive means includes index drive means for incrementally moving said multilevel end effector in order to locate a selected one of said plurality of end effector sets at a predetermined position for removal therefrom by said transport arm of the individual wafer supported thereon.

* * * * *